United States Patent
Balachandar et al.

(10) Patent No.: US 12,120,849 B2
(45) Date of Patent: Oct. 15, 2024

(54) POROUS SPREADER ASSISTED JET AND SPRAY IMPINGEMENT COOLING SYSTEMS

(71) Applicants: MAGNA INTERNATIONAL INC., Aurora (CA); Ram Balachandar, Windsor (CA); Abishek Sridhar, Windsor (CA); Lakshmi Varaha Iyer, Troy, MI (US); Gerd Schlager, Kefermarkt (AT)

(72) Inventors: Ram Balachandar, Windsor (CA); Abishek Sridhar, Windsor (CA); Lakshmi Varaha Iyer, Troy, MI (US); Gerd Schlager, Kefermarkt (AT)

(73) Assignee: MAGNA INTERNATIONAL INC., Aurora (CA)

( * ) Notice: Subject to any disclaimer, the term of this patent is extended or adjusted under 35 U.S.C. 154(b) by 208 days.

(21) Appl. No.: 17/784,868

(22) PCT Filed: Dec. 11, 2020

(86) PCT No.: PCT/US2020/064442
§ 371 (c)(1),
(2) Date: Jun. 13, 2022

(87) PCT Pub. No.: WO2021/119390
PCT Pub. Date: Jun. 17, 2021

(65) Prior Publication Data
US 2023/0010253 A1    Jan. 12, 2023

Related U.S. Application Data

(60) Provisional application No. 62/947,954, filed on Dec. 13, 2019.

(51) Int. Cl.
*H05K 7/20* (2006.01)
*F28F 13/00* (2006.01)

(52) U.S. Cl.
CPC ....... *H05K 7/20345* (2013.01); *F28F 13/003* (2013.01); *H05K 7/2039* (2013.01)

(58) Field of Classification Search
CPC ..... H01L 21/4884; H01L 23/13; H01L 23/34; H01L 23/36; H01L 23/3736;
(Continued)

(56) References Cited

U.S. PATENT DOCUMENTS

| | | | |
|---|---|---|---|
| 4,949,164 A | 8/1990 | Ohashi et al. | |
| 6,104,610 A * | 8/2000 | Tilton | H01L 23/4735 174/547 |
| 7,331,377 B1 * | 2/2008 | Toy | F28F 13/185 257/714 |
| 2005/0210906 A1 | 9/2005 | Laufer et al. | |

(Continued)

FOREIGN PATENT DOCUMENTS

EP       2151863 A1    2/2010

OTHER PUBLICATIONS

Extended European Search Report regarding corresponding EP App. No. 20898670.3; dated Nov. 9, 2022.

*Primary Examiner* — Amir A Jalali
(74) *Attorney, Agent, or Firm* — Dickinson Wright PLLC

(57) ABSTRACT

An impingement cooling system includes a porous heat spreader and a nozzle configured to direct a fluid as a jet and/or as a spray impinging upon the porous heat spreader. The porous heat spreader is made of a thermally-conductive material such as a metal, metal alloy, carbon/graphite, or ceramic, and is in thermal contact with a heat source. The nozzle may be configured to direct the fluid as a jet comprising a single component liquid or gas (including air) or a liquid mixture such as water-glycol or other coolants. The nozzle may be configured to direct the fluid as a spray comprising a single component liquid or gas (including air) or a liquid mixture such as water-glycol or other coolants. The cooling system may include one or more nozzles, which (Continued)

may direct the cooling fluid orthogonally or at an oblique angle to an impingement plate.

19 Claims, 11 Drawing Sheets

(58) Field of Classification Search
CPC ............... H01L 23/427; H01L 23/4275; H01L 23/4336; H01L 23/473; H01L 23/4735; H01L 33/64; H01L 33/648; H05K 7/20; H05K 7/20218; H05K 7/20254; H05K 7/2029; H05K 7/20327; H05K 7/20345; H05K 7/2039; H05K 7/20927; F28F 13/003; F28F 13/185
See application file for complete search history.

(56) References Cited

U.S. PATENT DOCUMENTS

| | | | |
|---|---|---|---|
| 2006/0133046 A1 | 6/2006 | Kim et al. | |
| 2012/0325436 A1* | 12/2012 | Shedd | H01L 23/427 165/104.11 |
| 2013/0032311 A1* | 2/2013 | Bhunia | F28D 15/046 165/104.26 |
| 2015/0007965 A1* | 1/2015 | Joshi | H01L 23/4735 165/185 |
| 2015/0009631 A1* | 1/2015 | Joshi | H01L 23/427 361/717 |
| 2017/0105313 A1* | 4/2017 | Shedd | H05K 7/20309 |
| 2017/0146273 A1* | 5/2017 | Spitzner | H05K 7/20336 |
| 2018/0331015 A1 | 11/2018 | Heymann | |
| 2019/0076900 A1 | 3/2019 | Ante et al. | |
| 2019/0364691 A1* | 11/2019 | Subrahmanyam | H05K 7/20518 |

* cited by examiner

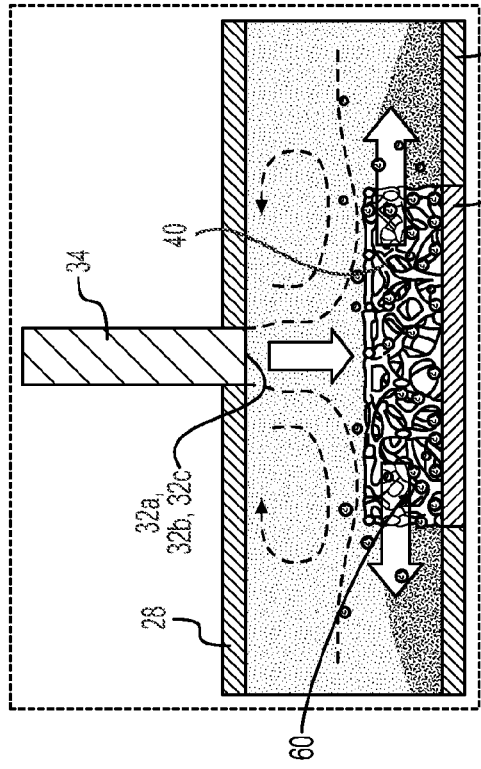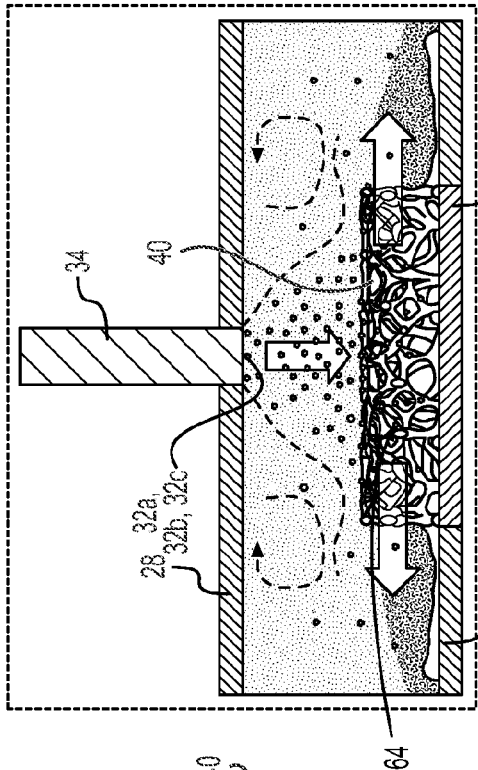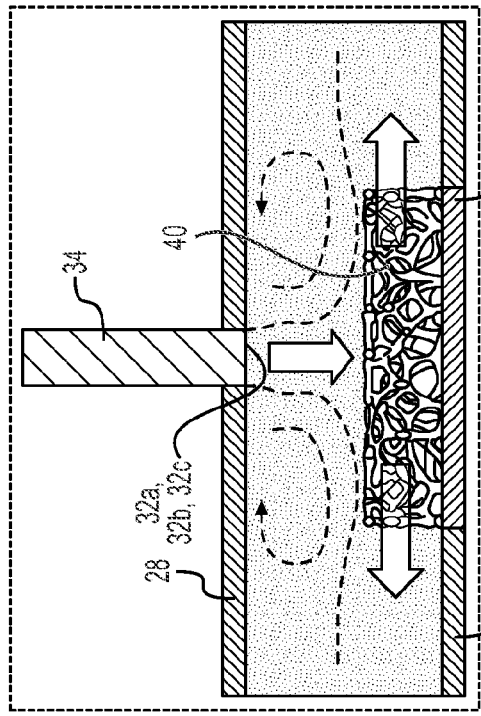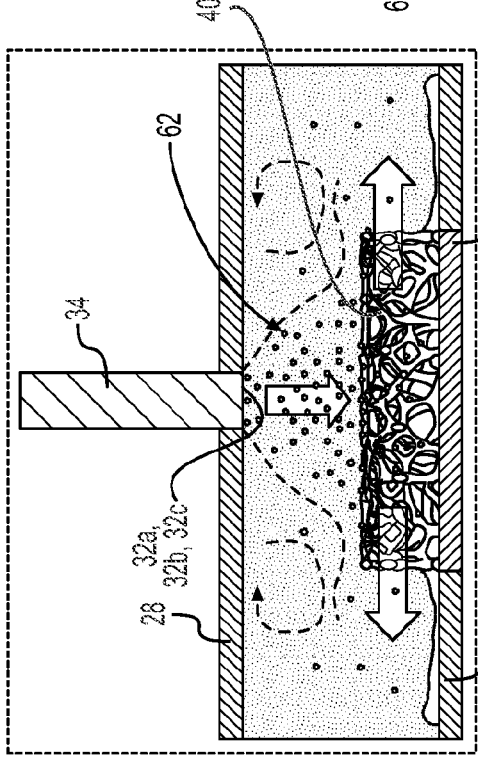

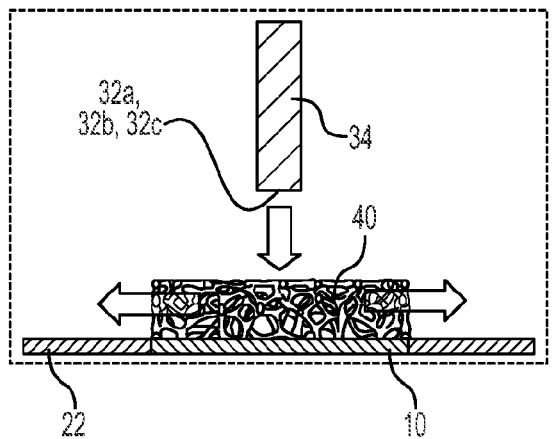 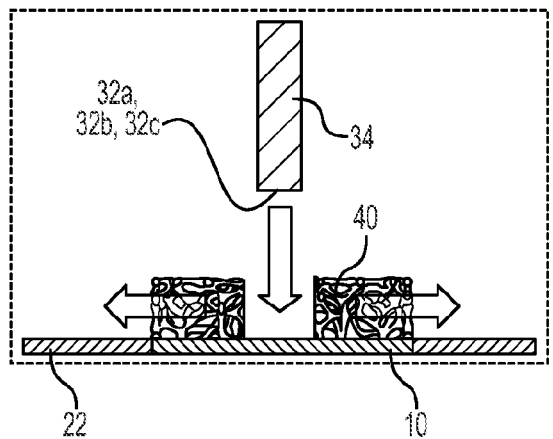
FIG. 6A  FIG. 6B
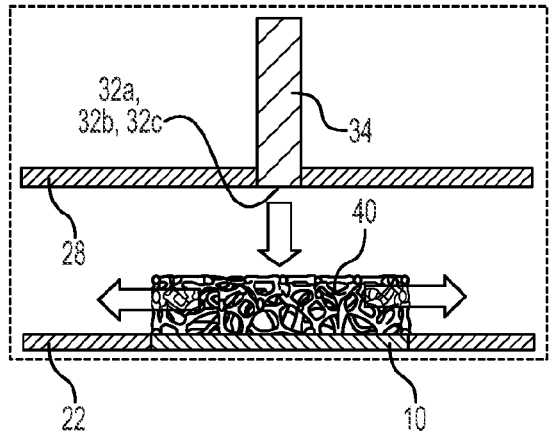 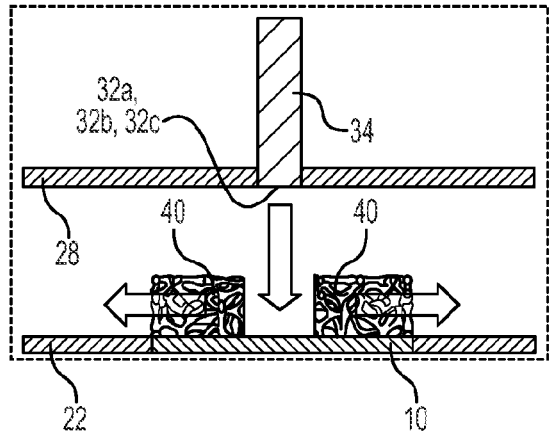
FIG. 6C  FIG. 6D
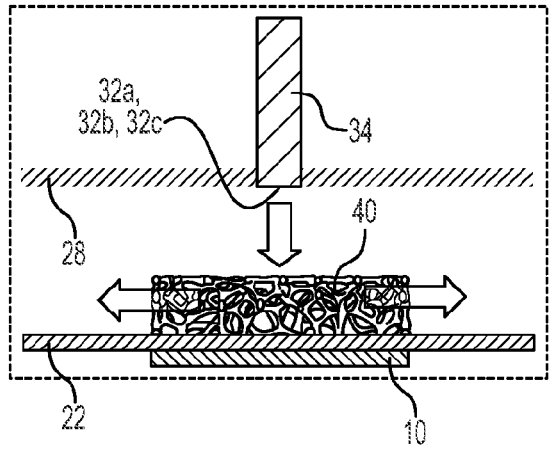 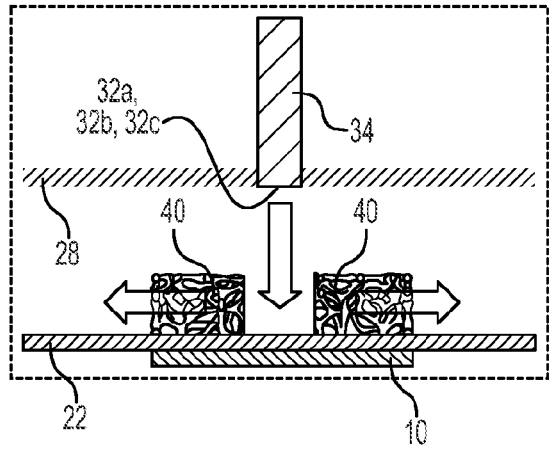
FIG. 6E  FIG. 6F

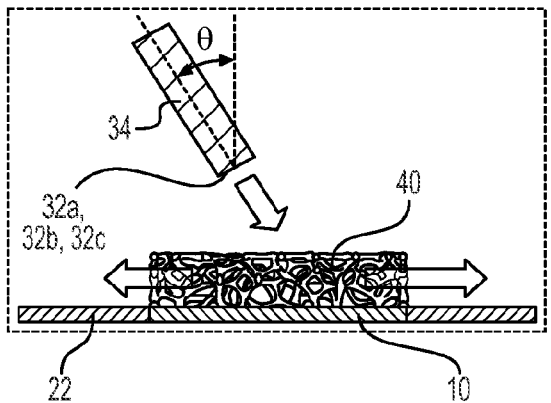
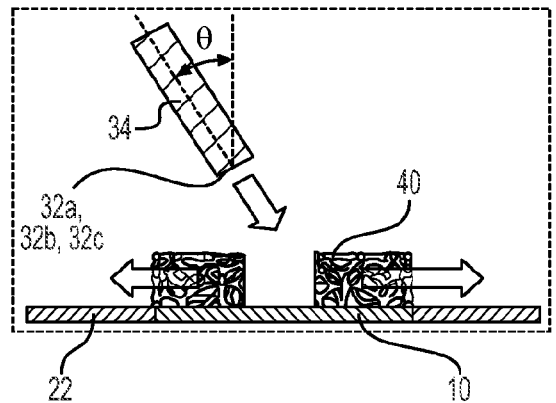
FIG. 8A  FIG. 8B
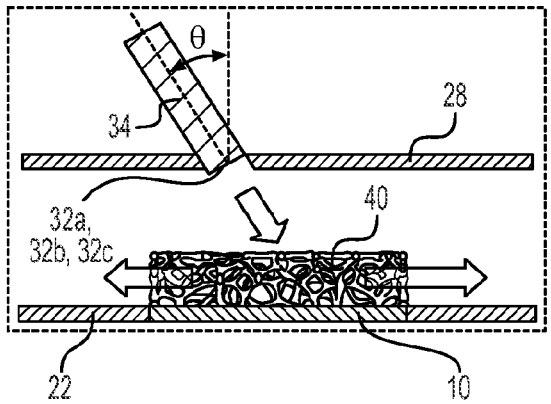
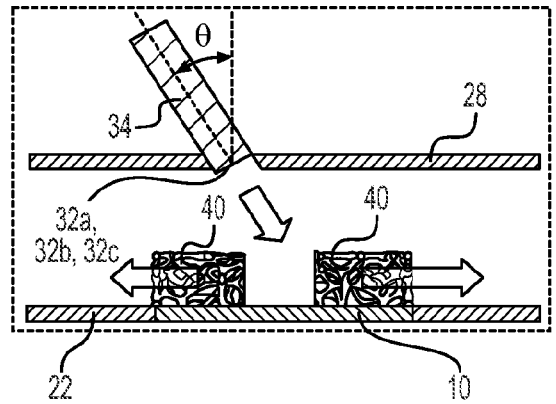
FIG. 8C  FIG. 8D
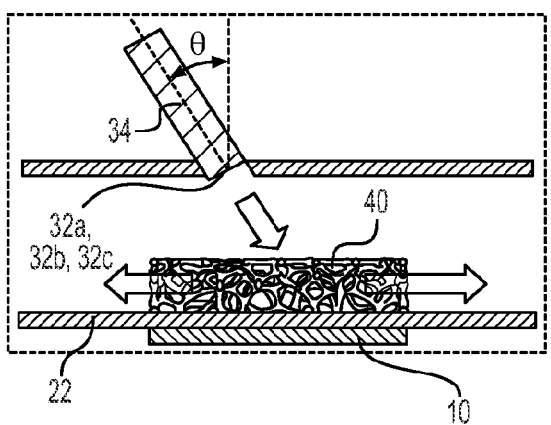
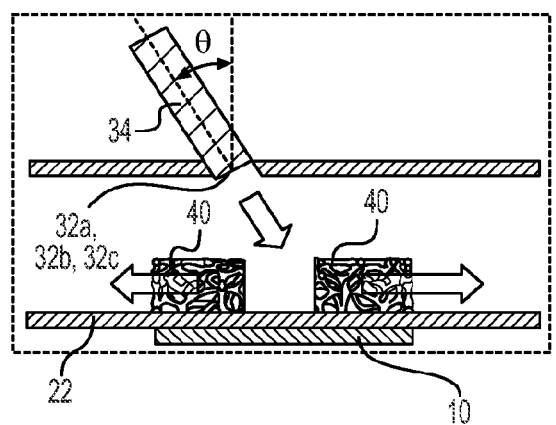
FIG. 8E  FIG. 8F

POROUS SPREADER ASSISTED JET AND SPRAY IMPINGEMENT COOLING SYSTEMS

CROSS-REFERENCE TO RELATED APPLICATIONS

This U.S. National Stage Patent Application claims the benefit of PCT International Patent Application Serial No. PCT/US2020/064442 filed Dec. 11, 2020 entitled "POROUS SPREADER ASSISTED JET AND SPRAY IMPINGEMENT COOLING SYSTEMS" which claims the benefit of and priority to U.S. Provisional Patent Application Ser. No. 62/947,954 filed on Dec. 13, 2019, titled "Porous Spreader Assisted Jet And Spray Impingement Cooling Systems," the entire disclosures of which are hereby incorporated by reference.

FIELD

The present disclosure relates generally to a cooling module for removing heat from a heat source. More specifically, it relates to a cooling module for cooling power electronics devices.

BACKGROUND

Efficient removal and management of waste heat is of vital significance in a variety of applications across several industries, including but not limited to, automotive, aerospace, miniature electronics, material processing, solar and renewable power generation, batteries, lighting, data-centers, drying, health care (diagnostics) and refrigeration. Efficient and cost effective cooling of concentrated targets or hot spots, such as in high density electronic modules used in such applications, has been a consistent and significant challenge. Continuing efforts towards miniaturization has further led to an inevitable and substantial increase in heat energy dissipated per unit area (or losses, such as in high power electronics), and has thus necessitated the development of novel and more efficient thermal management strategies. Single phase jet and spray impingement cooling schemes have widely been regarded to be potential candidates for addressing the cooling requirements of such systems, but are yet inadequate for large heat fluxes of the order of several 100 s W/cm$^2$ that are common in a multitude of applications including electric vehicle motor drives. Jet and spray cooling with phase change can help in augmentation of the overall cooling performance, but suffer from fluid incompatibility for a variety of systems, or are typically accompanied by an increase in flow pressure drop or pump work/energy.

SUMMARY

An impingement cooling system is provided. The impingement cooling system comprises a porous heat spreader in thermal contact with a heat source and a nozzle configured to direct a fluid as a jet or a spray impinging upon the porous heat spreader.

BRIEF DESCRIPTION OF THE DRAWINGS

Further details, features and advantages of designs of the invention result from the following description of embodiment examples in reference to the associated drawings.

FIGS. 5A-5D present schematic cut-away away side-views of cooling systems, each having a corresponding representative type of single, multicomponent single, and multiphase porous spreader jet and spray impingement cooling system according to aspects of the disclosure;

FIGS. 6A-6F present schematic cut-away away side-views of cooling systems having various impinging flow configurations, each with a single impinging flow orthogonal to a baseplate, according to aspects of the disclosure;

FIGS. 8A-8F present schematic cut-away away side-views of cooling systems having various impinging flow configurations, each with a single impinging flow at an inclined angle to a baseplate, according to aspects of the disclosure;

DETAILED DESCRIPTION

Figure 1:
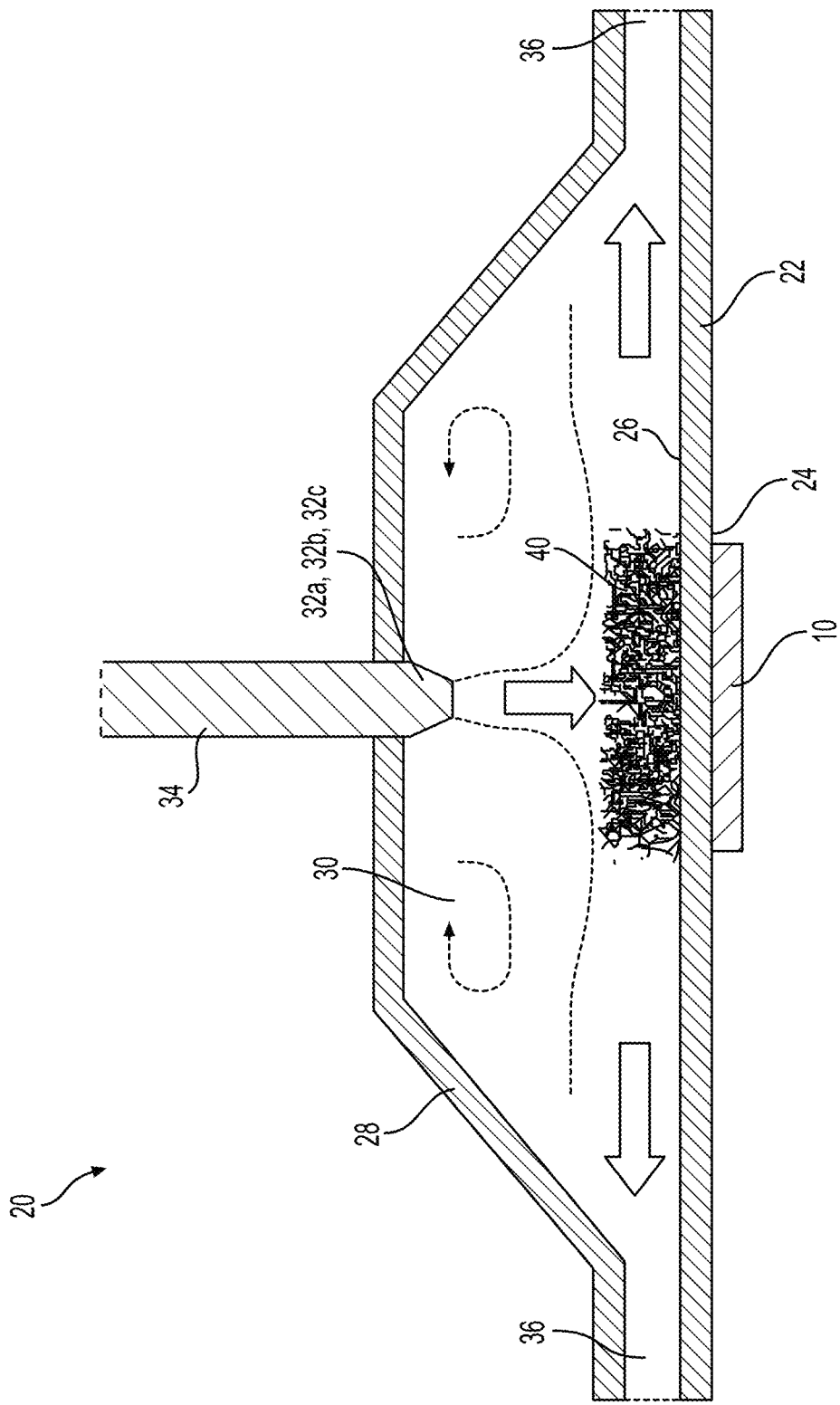
FIG. 1 presents a schematic cut-away away side-view of a cooling system according to aspects of the disclosure.

Recurring features are marked with identical reference numerals in the figures, in which example embodiments of a cooling system 20 for removing heat from one or more heat sources such as power electronic devices, on a circuit board are disclosed. Such a cooling system 20 may be especially useful in automotive applications where thermal management is critical and where operation over a wide range of temperatures and conditions is required. The subject cooling system 20 may be used, for example, to cool the heat sources in an electronic controller for an engine, transmission, audio/video, HVAC device, and/or another vehicular component. The subject cooling system 20 may be especially well suited for new generation power converters that employ Gallium Nitride and/or Silicon Carbide switches, which have a relatively small form factor and which may have precisely known positions where generated heat is concentrated.

While existing cooling technologies address the maximization of heat transfer coefficients for increasing the cooling performance, albeit at a cost, another aspect that can elevate the performance is the maximization of available surface area. This can be accomplished through the use of conductive porous structures such as open-cell foams or fibrous media, as passive heat spreaders. The recent advances in the manufacturability and customization of the microstructure of such porous media appear as a promising technology that can be exploited to make them work in conjunction with jets or sprays to substantially improve the overall cooling performance of the thermal management system. An objective of this disclosure, is to offer such a design of a novel heat removal or thermal management system that combines the advantages in single phase or multicomponent and multiphase (boiling or evaporative phase change) cooling methodologies involving jets or sprays and that of thermally conductive, structurally rigid, but highly open (high porosity) porous heat spreaders.

Efficient cooling of high (spatial) density heat sources in several applications has been a consistent challenge. Several technologies have tried to address this issue, and have made advances in optimizing the thermal management systems over the years. Impingement cooling systems have a unique advantage over other forced convective cooling schemes due to the substantially higher heat transfer coefficients that are obtained in and around the impingement stagnation region. The introduction of phase change through the boiling/condensation of the impinging liquid has further helped in heat transfer augmentation due to the additional heat removed through latent heat exchange, and other associated mechanisms pertinent during the ebullition process. In other cases, highly porous (porosity of 80-90%, or greater) have been reported to behave as excellent heat spreaders, if carefully engineered to have high pore sizes and large specific surface areas. However, the enhancements in heat transfer performance obtained from any of these techniques, individually, are easily offset by the complexity in the cooling system or the associated pressure drops. The presence of highly conductive open porous heat spreaders in an impingement cooling system is not only expected to additively combine the advantages in the heat transfer enhancements associated with each of the individual systems, but also have other beneficial characteristics that are unique to the combined cooling technology. Some of these include a substantial increase in flow turbulence in the wall jet regions during impingement flows—a region, where the heat transfer performance is much lower than at the stagnation point. This can help in reducing the overall pump work and coolant used, in addition to a substantial increase in the overall heat transfer rate. Besides, spatially varying porous spreaders with, for example, low porosity in the stagnation region, and carefully engineered porosity downstream of the stagnation point, can further substantially combine both the advantages in increased turbulence levels downstream and the high stagnation heat transfer coefficients under a relatively undisturbed impinging jet. For spray impingement systems, the presence of porous spreaders also increases the overall surface area available for cooling or evaporation for a fractional increase in the mass or weight of the system, thereby increasing the overall heat transfer performance of such a compact cooling module.

The present disclosure provides a hybrid thermal management system in the form of a cooling system 20 involving impingement cooling and porous heat spreaders. The various combinations of the two constituent entities are listed below and illustrated with schematics.

FIG. 1 shows an example cooling system 20, which may also be called a cooling module 20, having a baseplate 22 of thermally-conductive material, such as metal. The baseplate 22 may also be called an impingement plate 22, particularly in cases where fluid is directed to impinge directly thereupon. The baseplate 22 defines a first surface 24 in thermally-conductive communication with one or more heat sources 10. The heat sources 10 may be in direct physical contact with the baseplate 22 as shown in FIG. 1. Alternatively, a thermally-conductive device and/or substance may extend therebetween. For example, thermally-conductive paste may be used to enhance thermal conduction between the heat source 10 and the baseplate 22. Other devices, such as a heat pipe, may transfer heat between the heat source 10 and the baseplate 22, allowing the first source 10 to be physically spaced apart from the baseplate 22. The heat source 10 may be semiconductor switches, such as Si, SiC, and/or GaN-based devices. The heat source 10 may also be other devices such as, for example, capacitors, inductors, and/or transformers. The baseplate 22 also defines a second surface 26 opposite the first surface 24 and configured to transfer heat from the first heat sources 10 through the baseplate 22 and into a fluid in contact with the second surface 26. In other words, the baseplate 22 is preferably formed as a relatively thin sheet that is thick enough to maintain structural rigidity, but thin enough to efficiently conduct heat directly therethrough between the first surface 24 and the second surface 26.

In some embodiments, a housing, such as a confinement plate 28, which may also be called a top plate 28, overlies the baseplate 22 and defines a chamber 30 between the confinement plate 28 and the second surface 26 of the baseplate 22. In other embodiments, no such confinement plate 28 may be used. For example, the cooling apparatus of the present disclosure may be disposed within a larger housing or the cooling apparatus may be unconfined and exposed to ambient atmosphere. A nozzle 32a, 32b, 32c is in fluid communication with a fluid supply conduit 36 for receiving cooling fluid into the cooling system 20. One or more outlets 36 are configured for the fluid to drain out of the chamber 30. The one or more outlets 36 may extend between the confinement plate 28 and the baseplate 22 as shown in the example of FIG. 1. Alternatively or additionally, the one or more outlets 36 main include a passage through either or both of the confinement plate 28 and/or the baseplate 22. The nozzle 32a, 32b, 32c is configured to direct an impinging stream of cooling fluid as a jet and/or as a spray upon a porous heat spreader 40 which is disposed within the chamber 30 and in in thermal communication with the heat source 10.

In some embodiments, and as shown in FIG. 1, the porous heat spreader 40 is disposed on the second surface 26 of the baseplate 22 immediately across from the one or more heat sources 10. In some embodiments, one or more heat sources 10 may be disposed within the chamber 30. For example, one or more of the heat sources 10 may be submerged in the cooling fluid.

In some embodiments, the cooling system 20 has only one nozzle 32a, 32b, 32c. Alternatively, the cooling system 20 may have two or more nozzles 32a, 32b, 32c. In some embodiments, the porous heat spreader 40 is made of a thermally-conductive material such as a metal, metal alloy, carbon/graphite, and/or ceramic. In some embodiments, the porous heat spreader 40 comprises a porous media that is fibrous, a foam, a pin-fin matrix, or unstructured. However, the porous heat spreader 40 may be made of any porous material.

In some embodiments, the nozzle 32a, 32b, 32c is configured to direct the fluid as a jet comprising a single component liquid or gas (including air) or a liquid mixture, such as water-glycol or another coolant or coolants. Alternatively or additionally, the nozzle 32a, 32b, 32c may be configured to direct the fluid as a spray comprising a single component liquid or gas (such as air) or a liquid mixture such as water-glycol or another coolant or coolants.

In some embodiments, the nozzle 32a, 32b, 32c is configured to direct the fluid as a jet or a spray comprising a fluid in a non-phase change mode or in an evaporative/boiling phase change mode. The cooling system 20 may be configured such that all or part of the cooling fluid undergoes a phase change from a liquid to a gas on or within the porous heat spreader 40. For example, the coolant may include a refrigerant that readily undergoes a phase change from a liquid to a gas upon contacting the porous heat spreader 40, thereby removing heat therefrom. In some embodiments, the cooling system 20 may be operated at a temperature and/or pressure that are within a range where the coolant readily undergoes the phase change from a liquid to a gas. For example, where the coolant includes water, the cooling system 20 may be operated at or near atmospheric pressure and with the porous heat spreader 40 at a temperature greater than 100 C. For applications requiring a lower operating temperature, a different coolant, such as R134 or R410A refrigerant may be used.

In some embodiments, the nozzle 32a, 32b, 32c is configured to direct the fluid orthogonally to an impingement plate, such as the second surface 26 of the baseplate 22. In some embodiments, the nozzle 32a, 32b, 32c is configured to direct the fluid at an oblique angle to an impingement plate, such as the second surface 26 of the baseplate 22.

In some embodiments, the heat source 10 is in direct contact with the fluid and the porous heat spreader 40. In other words, the cooling system 20 may cool the heat source 10 using direct immersion cooling. Alternatively or additionally, the heat source 10 may be separated from the fluid and the porous heat spreader 40 by a thermally-conductive separator, such as the baseplate 22. In other words, the cooling system 20 may cool the heat source 10 using indirect immersion cooling.

In some embodiments, the porous heat spreader 40 is spatially homogeneous and isotropic. In other words, the porous heat spreader 40 may have a structure that is even or consistent structure in each of two or more orthogonal directions. For example, the porous heat spreader 40 may comprise a foam having a consistent macrostructure. Alternatively, the porous heat spreader 40 may be anisotropic. For example, the porous heat spreader 40 may have a spatially-varying microstructure and/or porosity. In some embodiments, the porous heat spreader 40 has a monolithic structure.

In some embodiments, the cooling system 20 includes a plurality of discrete porous heat spreaders 40, with each of the discrete porous heat spreaders 40 configured to conduct heat from a single, shared heat source 10. For example, the porous heat spreaders 40 may all be mounted upon or otherwise thermally associated with the single, shared heat source 10. Alternatively, each of the discrete porous heat spreaders 40 may be configured to conduct heat from a plurality of independent heat sources 10. For example, each of the porous heat spreaders 40 may be mounted upon or otherwise thermally associated with one or more corresponding heat sources 10. In some embodiments, there may be a one-to-one correspondence between the porous heat spreaders 40 the heat sources 10. Alternatively, two or more of the heat sources 10 may be associated with a single, shared one of the heat spreaders 40. Alternatively or additionally, two or more of the heat spreaders 40 may be associated with a single, shared one of the heat sources 10.

In some embodiments, and as shown for example in FIG. 1, the porous heat spreader 40 may be mounted within an enclosure, such as the chamber 30. Alternatively, the porous heat spreader 40 may be is mounted within a fully or partially confined arrangement, being at least partially exposed to an ambient atmosphere. In some embodiments, the porous heat spreader 40 may have a fully unconfined arrangement being entirely exposed to the ambient atmosphere.

The present disclosure provides a Jet Impingement system with a porous heat spreader 40, in which a fluid (gas, liquid or liquid mixture) with a known flow rate and temperature flows through the conduit (or inlet manifold) and enters the cooling module through one or more nozzles 32a, 32b, 32c of a specified shape (such as round, elliptical, square, rectangular cylinder or conical/frustum) and impinges on the bottom plate through the porous heat spreader (pin-fin matrix, fibrous, foam or unstructured). Spray cooling can operate with a given mean mass flow rate of the primary fluid, or purely with the atomized fluid, why may entrain some of the primary (or surrounding) fluid along with it during its motion towards the impingement plate 22. The system 20 can operate under different modes of confinement, including fully confined (a top plate 28 at or near the level the outlet of the nozzle 32a, 32b, 32c), partially confined (one or more nozzles 32a, 32b, 32c partially penetrated towards the heat spreader 40) and unconfined (no top plate 28). The jet nozzle(s) 32a, 32b, 32c can either be oriented orthogonally (perpendicular) to or at an arbitrary angle to the baseplate and the porous heat spreader. During multi jet impingement conditions, the nozzles 32a, 32b, 32c can each operate at different angles to the baseplate 22. In direct immersion cooling, the heat source 10 or the component that is required to be cooled is in direct contact with the porous spreader 40 and the cooling fluid. In indirect immersion cooling, a conductive baseplate 22 separates the heat source 10 from the coolant, and the porous spreader 40 is mounted on the baseplate. For cooling an array or matrix of heat sources, single of multiple jets can be employed in conjunction with a single or isolated or discrete set of porous heat spreaders mounted on each of the heated regions. The porous heat spreader can be screwed, welded, soldered, brazed to, or laid using an appropriate (thermally conductive) adhesive on, the baseplate or the heat source. In single phase cooling, the thermal load that is otherwise concentrated around the region of the heat source, is spread through conduction in the porous media, and is lost to the coolant. During subcooled or saturated impingement boiling conditions, the porous media creates additional nucleation sites and elevates latent heat exchange (through evaporation), along with enhancements to other ebullition mechanisms such as transient quenching (single phase convective heat transfer to the void of a departed bubble). The presence of highly open (high porosity) porous media further aids in elevating the turbulence levels close to the heat source, and consequently enhances convective heat transfer. The fluid (or along with the vapor under boiling conditions) exit the cooling module through one or more outlet placed along the baseplate, parallel to the nozzle 32a, 32b, 32c, or at another appropriate orientation, to be recycled (in the case of liquid cooling) through a heat exchanger and condenser (for two-phase cooling), or lost to the surroundings (in the case or air cooling). A condenser may or may not be required depending on the temperature of the inlet fluid during operation in the two-phase cooling mode. Under substantial levels of inlet fluid subcooling, the bubbles that are formed on the porous heat spreader, baseplate or the heat source, can condense in the free stream, and a heat exchanger may be required to recycle the fluid back to the jet conduit and nozzle 32a, 32b, 32c. The cooling module 20 can operate with the jet(s) oriented along the direction of gravity (i.e.

straight up or straight drown) or at an angle to the direction of gravity for terrestrial applications, and in any arbitrary orientation for microgravity and space applications.

The present disclosure also provides a spray impingement system with porous heat spreaders 40, in which a pair of fluids involving the primary (carrier) fluid normally a gas (or liquid in some instances) and a secondary (dispersed) fluid of another partially or fully immiscible material (liquid or liquid mixture). The primary fluid with a known flow rate, and temperature flows through the conduit (or inlet manifold connected to multiple nozzles 32a, 32b, 32c) and enters the cooling module through one or more nozzles 32a, 32b, 32c of a specified shape (such as round, elliptical, square, rectangular cylinder or conical/frustum) and impinges on the bottom plate through the porous heat spreader (pin-fin matrix, fibrous, foam or unstructured). The dispersed fluid with a known flow rate, temperature, desired volume fraction (with reference to the primary fluid), and droplet size distribution also enters the cooling module through the same single or array or nozzles 32a, 32b, 32c. The atomization or formation of secondary fluid droplets or mist can either be at the nozzle 32a, 32b, 32c or the droplets could be generated before the nozzle 32a, 32b, 32c and the partially or fully immiscible fluid mixture eject from the nozzle 32a, 32b, 32c to impinge on the porous heat spreader 40, baseplate 22 and/or the heat source 10. The system can operate under different modes of confinement, including fully confined (a top plate 28 at the level of the outlet of the nozzle 32a, 32b, 32c), partially confined (nozzle 32a, 32b, 32c partially penetrated towards the porous spreader 40) and unconfined (i.e., without a confinement top plate 28). The spray nozzle (s) 32a, 32b, 32c can either be oriented orthogonally (perpendicular) to or at an arbitrary angle to the baseplate 22 and the porous heat spreader. During multi-spray impingement conditions, the nozzles 32a, 32b, 32c can each operate at different angles to the baseplate 22. In direct immersion cooling, the heat source 10 or the component that is required to be cooled is in direct contact with the porous spreader 40 and the cooling fluids. In indirect immersion cooling, a conductive baseplate 22 separates the heat source from the coolant, and the porous spreader 40 is mounted on the baseplate 22. For cooling an array or matrix of heat sources, single of multiple sprays can be employed in conjunction with a single or isolated or discrete set of porous heat spreaders 40 mounted on each of the heated regions. The porous heat spreader 40 can be screwed, welded, soldered, brazed to, or laid using an appropriate (thermally conductive) adhesive on, the baseplate 22 or the heat source 10. During non-evaporative cooling, the thermal load that is otherwise concentrated around the region of the heat source, is spread through conduction in the porous media, and is lost to the coolants. The droplets (normally of a fluid that has better thermal cooling properties than the primary fluid) may form a thin liquid film on the impingement plate 22 and the porous spreader 40 and redistribute during operating, to finally be removed through one or more of the outlets. During subcooled or saturated evaporative spray cooling conditions, the porous media enhances the overall surface area available for evaporation, and the droplets change phase from liquid to vapor upon contact with the superheated sections of the porous media and the baseplate or heat source. The presence of highly open (high porosity) porous media further aids in elevating the turbulence levels close to the heat source, and consequently enhances convective heat transfer. The carrier fluid (or along with the vapor under evaporative spray cooling conditions) exits the cooling module through one or more outlet placed along the baseplate, parallel to the nozzle, or at another appropriate orientation to be recycled through a heat exchanger and condenser (for evaporative cooling), or lost to the surroundings (in the case or air/water-droplet cooling). A condenser may or may not be required depending on the temperature of the inlet fluid during operation in the evaporative cooling mode. Under substantial levels of inlet subcooling of the primary phase (compared to the saturation temperature of the secondary fluid), the vapor formed on the porous heat spreader, baseplate or the heat source can condense in the free stream, and a heat exchanger may be required to recycle the fluid back to the spray conduit and nozzle. At or beyond the outlets, the secondary fluid will be separated from the primary fluid using an appropriate gas-liquid or liquid-liquid filter, cyclone or other separation device before being recycled into the cooling module. The cooling module can operate with the spray(s) oriented along the direction of gravity or at an angle to the direction of gravity for terrestrial applications, and in any arbitrary orientation for microgravity and space applications.

The cooling system 20 of the present disclosure includes an impingement fluid system 30 having one or more a nozzles 32a, 32b, 32c configured to direct an impinging stream of cooling fluid upon a porous heat spreader 40.

Several different classifications of the impingement fluid system 30 are provided, including:
(a) Single component Jet impingement with one or more nozzles 32a, 32b, 32c having, for example, a cylindrical, parallelepipedal, or frustum (conical) form.
 (i) Single or multiple, normal or inclined jet impingement operating in single phase flow, with gases, liquids or liquid mixtures;
 (ii) Single or multiple, normal or inclined jet impingement operating in multiphase flow, involving subcooled or saturated boiling on the porous spreader and impingement surfaces, with liquids or liquid mixtures; and
 (iii) Fully or partially confined, or unconfined single or multiple, normal or inclined jet impingement with gases or liquids, and with or without boiling phase change.
(b) Multi component Spray impingement with one or more nozzles 32a, 32b, 32c having, for example, a cylindrical, parallelepipedal, or frustum (conical) form.
 (i) Single or multiple, normal or inclined spray impingement operating in non-evaporative flow, with gases as primary (carrier) component, and liquids or liquid mixtures in the dispersed droplet/atomized component;
 (ii) Single or multiple, normal or inclined spray impingement operating, with gases as primary (carrier) component, and liquids or liquid mixtures in the dispersed droplet/atomized component, and involving evaporation of the droplets on contact with the porous heat spreader and impingement surfaces; and
 (iii) Fully or partially confined, or unconfined single or multiple, normal or inclined spray impingement, and with or without evaporative phase change.

Several different classifications of the porous heat spreader 40 are provided, including:
(a) Spatially homogeneous, heterogeneous, or locally homogeneous but spatially varying porous media;
(b) Open-cell foam, fibrous, pin-fin matrix, unstructured or combinations of these;
(c) Porous heat spreader covering fully or partially (stagnation or wall jet region alone) or extending beyond the region required to be cooled;

(d) Porous heat spreader directly mounter on the heat generating component in a direct-immersion cooling configuration, or placed on a separate conductive material, in an indirect immersion cooling configuration; and (e) Porous structure made of thermally conductive materials such as aluminum, copper or other metals, metal alloys, carbon or graphite, and ceramics.

Figure 2A:
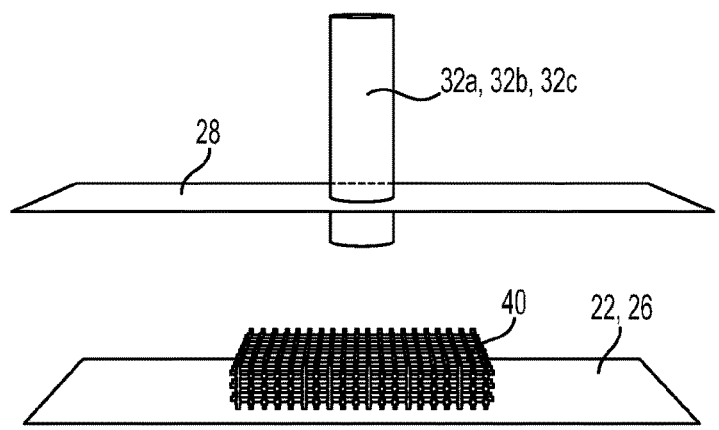
FIGS. 2A-2C are cut-away views of a cooling system with a heat spreader made of various different porous materials used for the according to aspects of the disclosure.
Figure 2B:
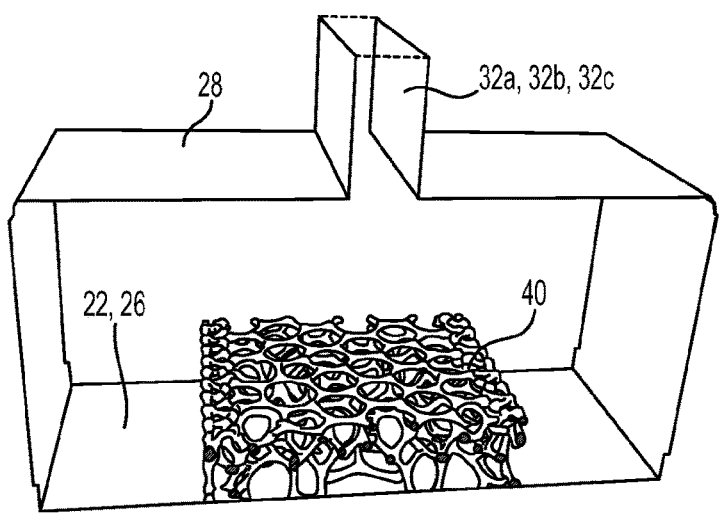
Figure 2C:
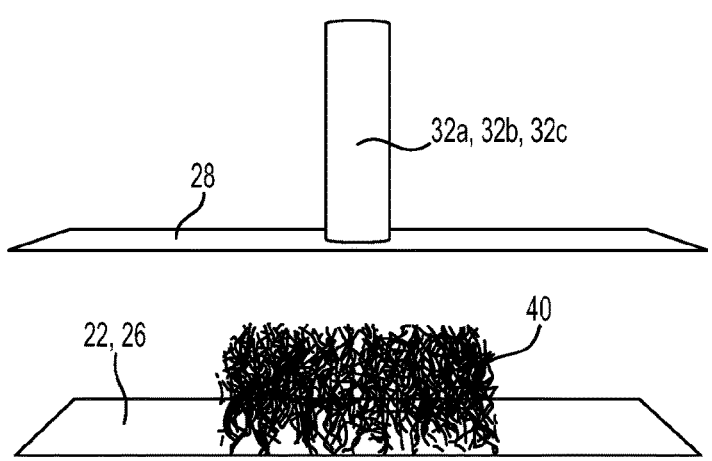

FIGS. 2A-2C show different examples of porous materials used for the porous heat spreader 40. Specifically, FIG. 2A shows an example cooling system 20 that includes a Pin-Fin Matrix type porous material used as the porous heat spreader 40. The illustrated Pin-Fin Matrix includes a matrix of rods or pins, including a first grid that extends vertically and parallel to a direction of coolant flow, and a second grid that extends horizontally, or orthogonally to the first grid, with the first and second grids each intersecting at nodes at each of a plurality of layers. FIG. 2B shows an example cooling system 20 that includes an open-cell foam type porous material used as the porous heat spreader 40. FIG. 2C shows an example cooling system 20 that includes a fibrous material type porous material used as the heat spreader 40. It should be appreciated that these are merely examples, and that other arrangements or types of porous material may be used in the porous heat spreader 40, and the porous heat spreader 40 may include two or more different types of porous materials.

Figure 3:
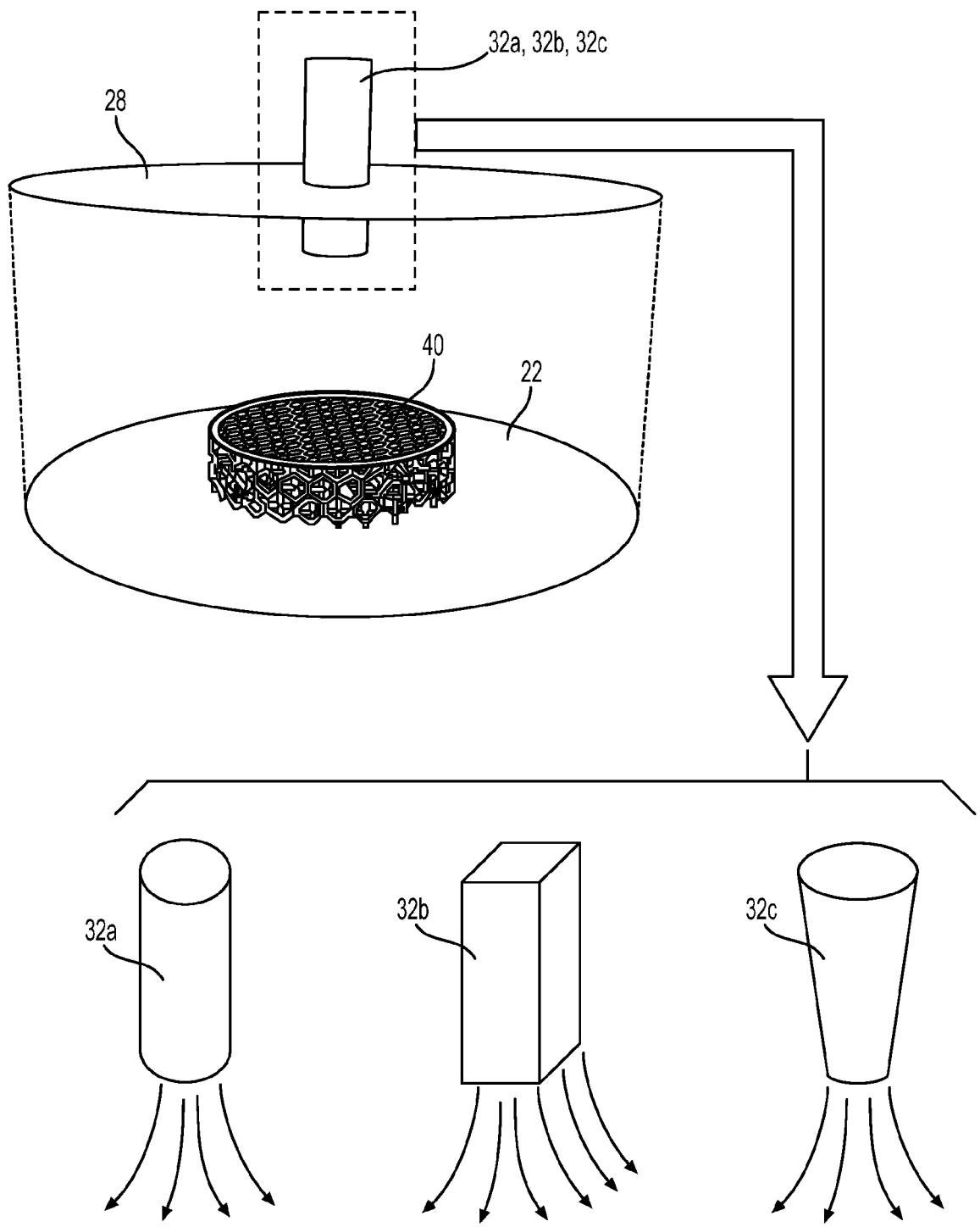
FIG. 3 is a perspective view of a cooling system having an impingement fluid system with three different types of nozzles according to aspects of the disclosure.

FIG. 3 shows an example cooling system 20 having an impingement fluid system 30 with three different types of nozzles 32a, 32b, 32c. Specifically, FIG. 3 shows the example cooling system 20 with three different types of nozzles 32a, 32b, 32c for the jet or spray impingement cooling system with a porous heat spreader 40. The three different types of nozzles shown on FIG. 3 include a circular/elliptical (cylindrical) nozzle 32a, a square/rectangular (parallelepiped) nozzle 32b, and conical (frustum) shaped nozzle 32c. The circular/elliptical (cylindrical) nozzle 32a extends along an axis, and has a constant circular or elliptical cross-sectional shape in a plane that is perpendicular to the axis. Similarly, the square/rectangular (parallelepiped) nozzle 32b extends along an axis, and has a constant square or rectangular cross-sectional shape in a plane that is perpendicular to the axis. The conical (frustum) shaped nozzle 32c extends along an axis, and has a frusto-conical shape that tapers along the axis.

Figure 4A:
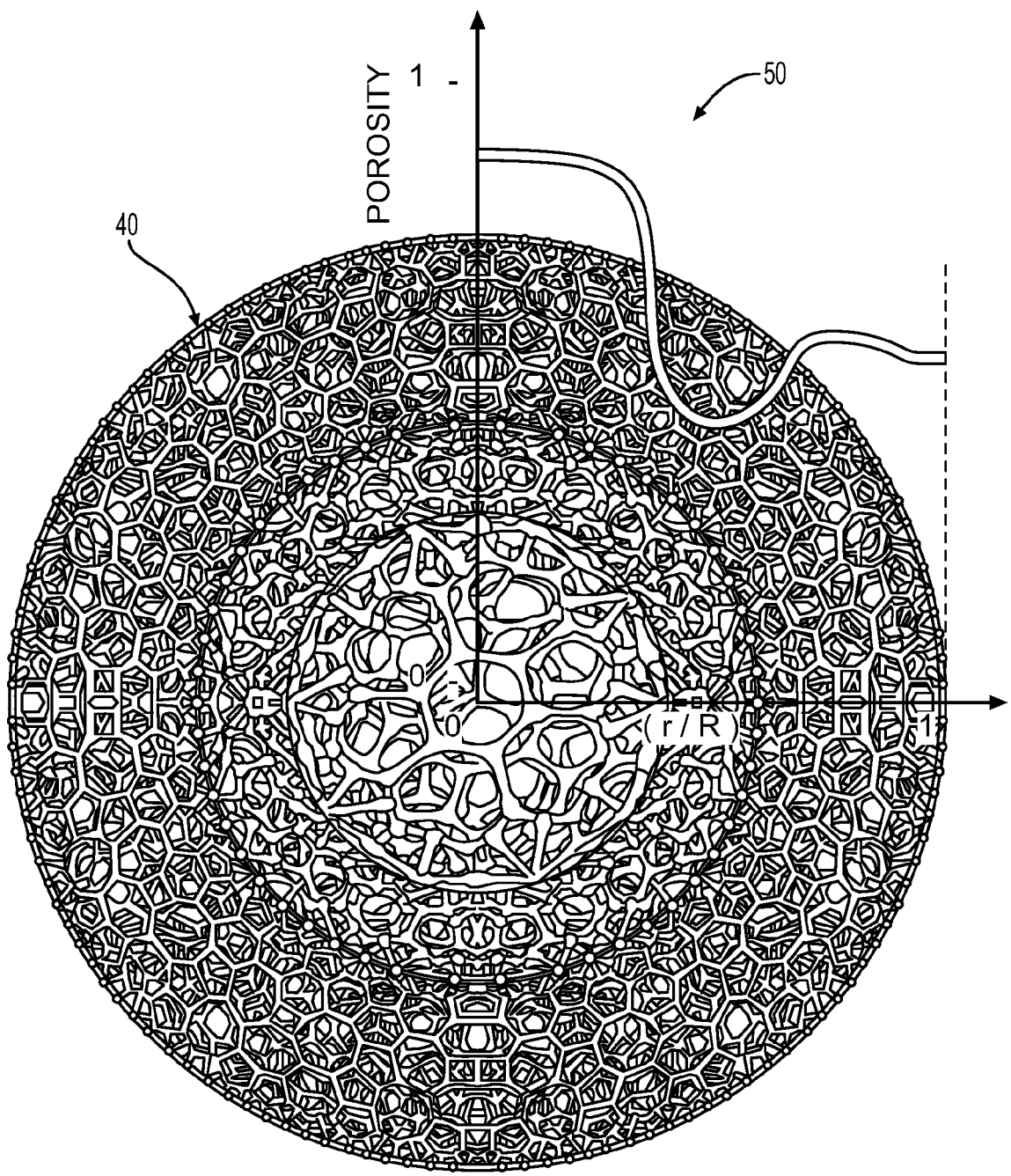
FIG. 4A is a top view of a spatially in-homogenous porous heat spreader overlaid with a graph showing porosity of the heat spreader as a function of radial position according to aspects of the disclosure.
Figure 4B:
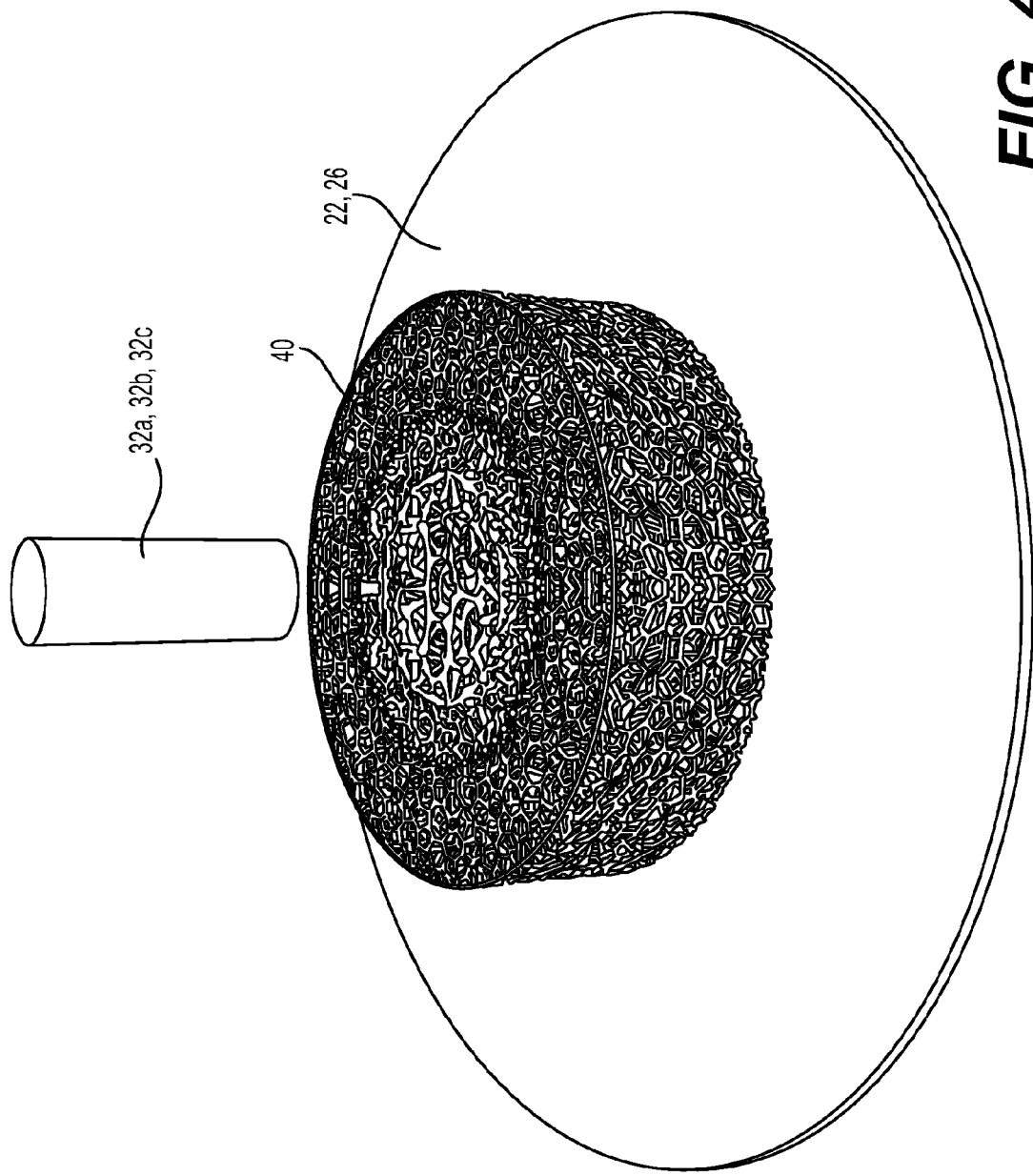
FIG. 4B is a perspective view of a cooling system including the spatially in-homogenous porous heat spreader according to aspects of the disclosure.

In some embodiments, the porous heat spreader 40 has first porosity at a first location where the fluid impinges thereupon, and a second porosity, less than the first porosity, at a second location spaced apart from the first location. The first porosity may be selected to optimize initial heat transfer while simultaneously providing for the cooling fluid to flow into the porous heat spreader 40. The lower, second porosity may provide for enhanced flow characteristics, which may be selected to optimize cooling at such second locations. In some embodiments, the porous heat spreader 40 has a third porosity, which is greater than the second porosity, at a third location that is spaced further apart from the first location such that the second location is between the first location and the third location. This greater third porosity may provide for enhanced coolant flow from the impinging jet and through the second locations, which may improve the overall cooling ability of the porous heat spreader 40. An example of such a configuration is shown in FIG. 4A, which shows an example embodiment of the porous heat spreader 40 with a spatially in-homogenous porous construction, overlaid with a graph 50 showing porosity of the heat spreader 40 as a function of radial position along a radius that extends perpendicularly to the fluid flow in the impinging jet. Specifically, the graph 50 indicates porosity of the porous heat spreader 40 as a function of the radial position r up to a full radial width R of the heat spreader 40 (i.e., on a scale of r/R between 0 and 1). FIG. 4B is a perspective view of a cooling system 20 including the spatially in-homogenous porous heat spreader 40 shown in FIG. 4A. It should be appreciated that other arrangements or configurations are possible for constructing a spatially in-homogenous porous heat spreader 40, such as a design that has varying porosity in a direction parallel to the fluid flow in the impinging jet.

FIGS. 5A-5D present schematic cut-away away side-views of cooling systems 20, with each of the various cooling systems 20 having corresponding representative type of single, multicomponent single, and multiphase porous spreader jet and spray impingement cooling system according to aspects of the disclosure.

FIG. 5A shows a single-component jet impingement on a porous spreader 40 configured for single-phase cooling. A cooling fluid, such as air or another gas; a liquid, such as water, a dielectric coolant, and/or a mixture of different liquids may be used. In this example, the cooling fluid is directed from the nozzle 34 onto and through the porous heat spreader 40.

FIG. 5B shows a single-component jet impingement on a porous spreader 40 configured for multiphase (e.g. phase-change or boiling) cooling. A cooling fluid, which may be a liquid, such as water, a dielectric coolant, and/or a mixture of different liquids may be used. In this example, the cooling fluid is directed from the nozzle 34 onto and through the porous heat spreader 40, where bubbles 60 are formed from the cooling fluid boiling on or within the porous heat spreader 40.

FIG. 5C shows a multi-component jet impingement on a porous spreader 40 configured for non-evaporative spray cooling. A primary fluid, such as air or another gas, together with a secondary fluid, are sprayed together from a single, shared, nozzle. The secondary fluid may be a liquid, such as water, a dielectric coolant, and/or a mixture of different liquids. In this example, the primary and secondary cooling fluids are directed from the nozzle 34 onto and through the porous heat spreader 40. The secondary fluid takes the form of spray droplets 62 that are carried by the primary fluid.

FIG. 5D shows a multi-component jet impingement on a porous spreader 40 configured for multiphase (e.g. phase-change or boiling) cooling. A primary fluid, such as air or another gas, together with a secondary fluid, are sprayed together from a single, shared, nozzle. The secondary fluid may be a liquid, such as water, a dielectric coolant, and/or a mixture of different liquids. In this example, the primary and secondary cooling fluids are directed from the nozzle 34 onto and through the porous heat spreader 40. Spray droplets of the secondary fluid may evaporate or boil to form a gas 64 on or within the porous heat spreader 40.

FIGS. 6A-6F FIG. 6 presents schematic cut-away away side-views of cooling systems 20 having various impinging flow configurations, each with impinging flows orthogonal to a target, such as the baseplate 22, according to aspects of the disclosure.

FIG. 6A shows a cooling system 20 with unconfined submerged immersion cooling, according to an aspect of the disclosure. Specifically, FIG. 6A shows the cooling system 20 in which a single jet of cooling fluid is directed from a nozzle 32a, 32b, 32c onto and through a single porous heat spreader 40. The unconfined submerged immersion cooling system 20 of FIG. 6A includes the heat source 10 in direct contact with the porous heat spreader 40. Specifically, the heat source 10 extends through a hole or aperture in the baseplate 22. Such an unconfined submerged immersion cooling system 20 may have another arrangement, for example, without a baseplate 22. Furthermore, the heat source 10 may not include the original source of heat. For example, the heat source 10 may be a heat sink that is in thermal communication with an original source of heat, such as an electronic device that generates heat. FIG. 6B shows an example cooling system 20 with unconfined submerged immersion cooling, similar or identical to the cooling system 20 of FIG. 6A, but where the jet of cooling fluid is directed onto and/or through multiple discrete porous heat spreaders 40, which are each in direct contact with the heat source 10.

FIG. 6C shows a cooling system 20 with confined submerged immersion cooling, according to an aspect of the disclosure. Specifically, FIG. 6C shows the cooling system 20 in which a single jet of cooling fluid is directed from a nozzle 32a, 32b, 32c onto and through a single porous heat spreader 40. A confined space containing the porous heat spreader 40 is defined between baseplate 22 and confinement plate 28. The confined submerged immersion cooling system 20 of FIG. 6C includes the heat source 10 in direct contact with the porous heat spreader 40, similar to the arrangement of FIG. 6A. FIG. 6D shows an example cooling system 20 with unconfined submerged immersion cooling, similar or identical to the cooling system 20 of FIG. 6C, but where the jet of cooling fluid is directed onto and/or through multiple discrete porous heat spreaders 40, which are each in direct contact with the heat source 10.

FIG. 6E shows a cooling system 20 with non-contact (confined or unconfined) submerged immersion cooling, according to an aspect of the disclosure. Specifically, FIG. 6E shows the cooling system 20 in which a single jet of cooling fluid is directed from a nozzle 32a, 32b, 32c onto and through a single porous heat spreader 40, which is separated from the heat source 10 by the baseplate 22. In other words, the baseplate 22 conducts heat from the heat source 10 to the porous heat spreader 40. The porous heat spreader 40 may be confined by a confinement plate 28, similar to the arrangement of FIG. 6C. Alternatively, the porous heat spreader 40 may be unconfined, similar to the arrangement of FIG. 6A. FIG. 6F shows an example cooling system 20 with non-contact (confined or unconfined) submerged immersion cooling, similar or identical to the cooling system 20 of FIG. 6E, but where the jet of cooling fluid is directed onto and/or through multiple discrete porous heat spreaders 40, which are each in indirect thermal contact with the heat source 10.

FIGS. 7A-7F present schematic cut-away away side-views of cooling systems 20 having various impinging flow configurations, each with multiple impinging flows orthogonal to a baseplate, according to aspects of the disclosure.

Figure 7A:
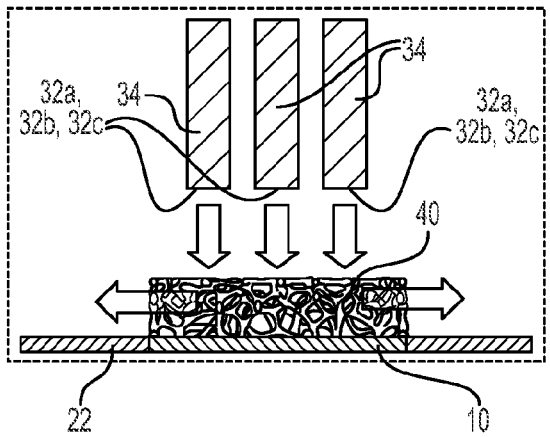
FIGS. 7A-7F present schematic cut-away away side-views of cooling systems having various impinging flow configurations, each with multiple impinging flows orthogonal to a baseplate, according to aspects of the disclosure.
Figure 7B:
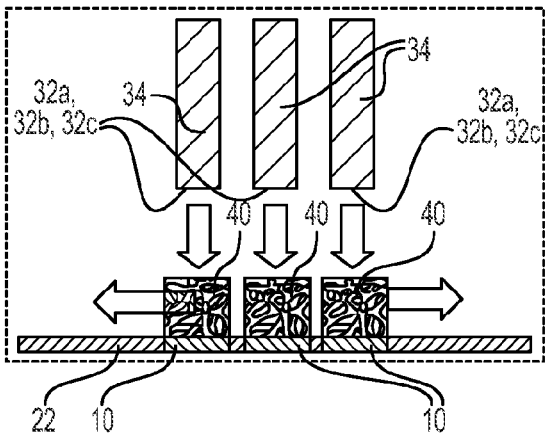

FIG. 7A shows a cooling system that is similar or identical to the cooling system 20 of FIG. 6A, but with three nozzles 32a, 32b, 32c each directing a flow of cooling fluid onto a single, shared porous heat spreader 40. Similarly, FIG. 7B shows a cooling system that is similar or identical to the cooling system 20 of FIG. 6B, but with three nozzles 32a, 32b, 32c each directing a flow of cooling fluid onto a corresponding discrete porous heat spreader 40. It should be appreciated that the quantity of three nozzles 32a, 32b, 32c is merely an example, and any number of nozzles 32a, 32b, 32c may be used.

Figure 7C:
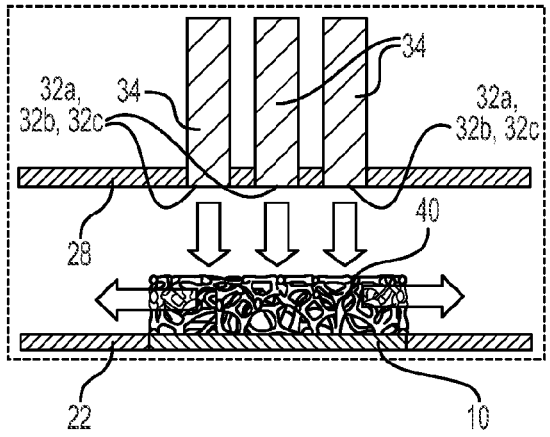
Figure 7D:
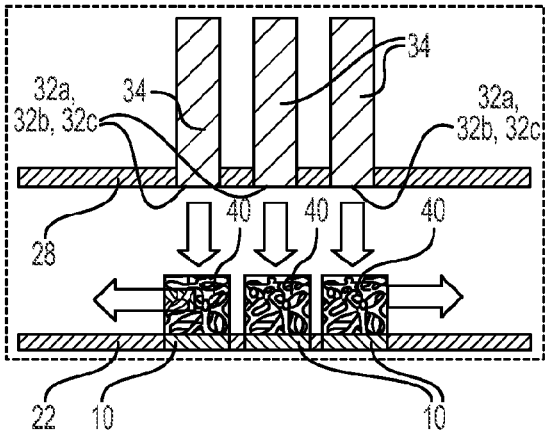

FIG. 7C shows a cooling system that is similar or identical to the cooling system 20 of FIG. 6C, but with three nozzles 32a, 32b, 32c each directing a flow of cooling fluid onto a single, shared porous heat spreader 40. Similarly, FIG. 7D shows a cooling system that is similar or identical to the cooling system 20 of FIG. 6D, but with three nozzles 32a, 32b, 32c each directing a flow of cooling fluid onto a corresponding discrete porous heat spreader 40. It should be appreciated that the quantity of three nozzles 32a, 32b, 32c is merely an example, and any number of nozzles 32a, 32b, 32c may be used.

Figure 7E:
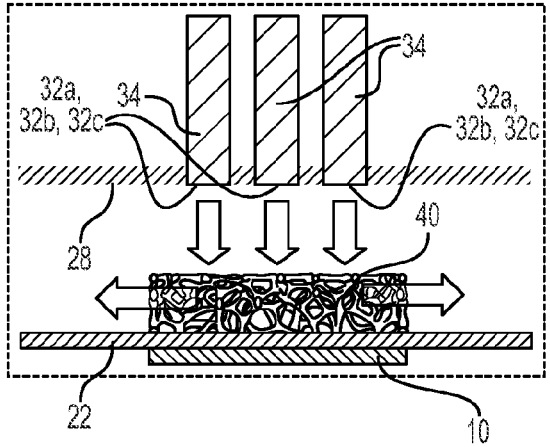
Figure 7F:
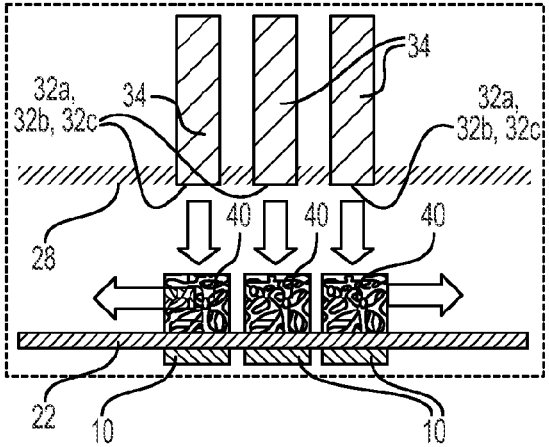
Figure 9A:
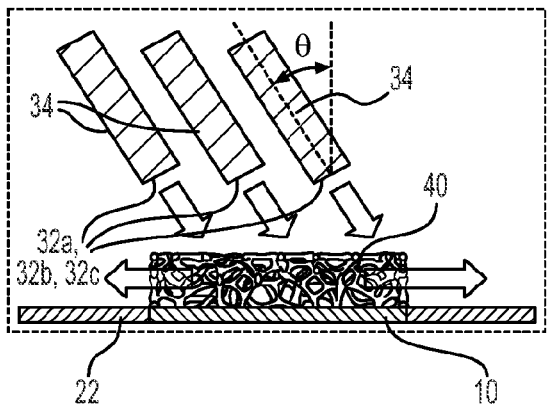
FIGS. 9A-9F present schematic cut-away away side-views of cooling systems having various impinging flow configurations, each with multiple impinging flows at an inclined angle to a baseplate, according to aspects of the disclosure.
Figure 9B:
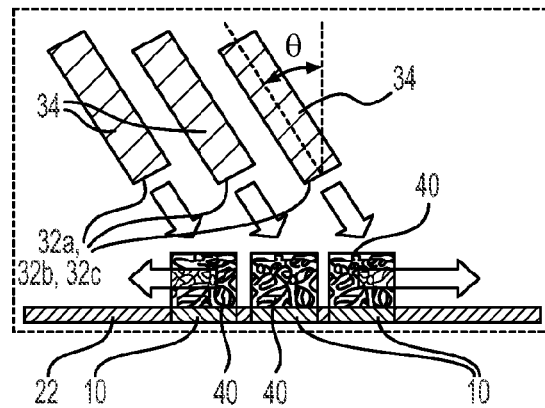
Figure 9C:
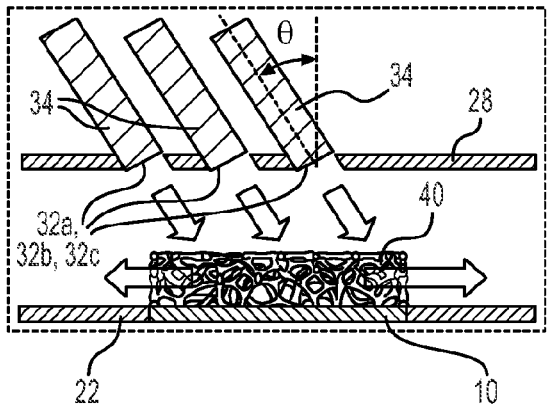
Figure 9D:
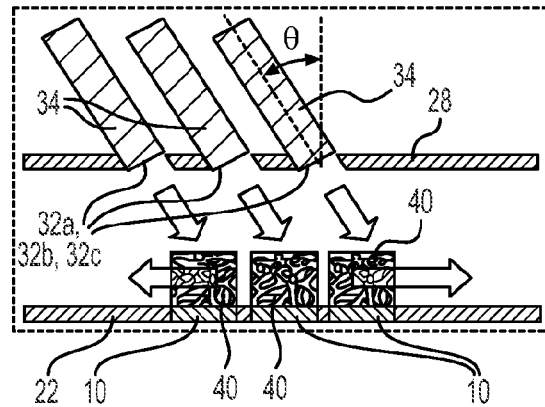
Figure 9E:
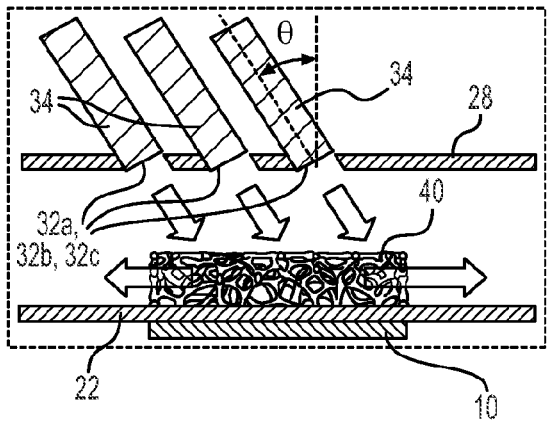
Figure 9F:
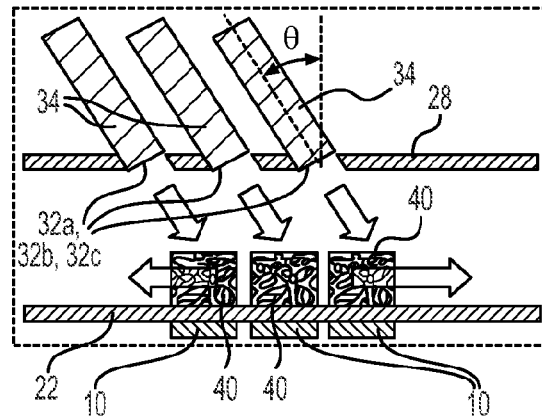

FIG. 7E shows a cooling system that is similar or identical to the cooling system 20 of FIG. 6E, but with three nozzles 32a, 32b, 32c each directing a flow of cooling fluid onto a single, shared porous heat spreader 40. Similarly, FIG. 7F shows a cooling system that is similar or identical to the cooling system 20 of FIG. 6F, but with three nozzles 32a, 32b, 32c each directing a flow of cooling fluid onto a corresponding discrete porous heat spreader 40. It should be appreciated that the quantity of three nozzles 32a, 32b, 32c is merely an example, and any number of nozzles 32a, 32b, 32c may be used.

In some embodiments, and as shown in FIGS. 6A-6F, and 7E-7F, some or all of the nozzles 32a, 32b, 32c may be configured to direct corresponding jets of cooling fluid in a direction orthogonal to the baseplate 22 and/or orthogonal to the heat source 10.

FIGS. 8A-8F present schematic cut-away away side-views of cooling systems 20, each having various impinging flow configurations, each with a single impinging flow at an inclined angle θ to the baseplate 22, according to aspects of the disclosure. Each of FIGS. 8A-8F shows an arrangement that is similar or identical to a corresponding one of FIGS. 6A-6F, but with the nozzles 32a, 32b, 32c configured to direct corresponding jets of cooling fluid at an inclined angle to the baseplate 22 and/or the heat source 10.

FIGS. 9A-9F present schematic cut-away away side-views of cooling systems 20, having various impinging flow configurations, each with multiple impinging flows at an inclined angle θ to the baseplate 22, according to aspects of the disclosure. Each of FIGS. 9A-9F shows an arrangement that is similar or identical to a corresponding one of FIGS. 7A-7F, but with the nozzles 32a, 32b, 32c configured to direct corresponding jets of cooling fluid at an inclined angle to the baseplate 22 and/or the heat source 10.

Figure 10:
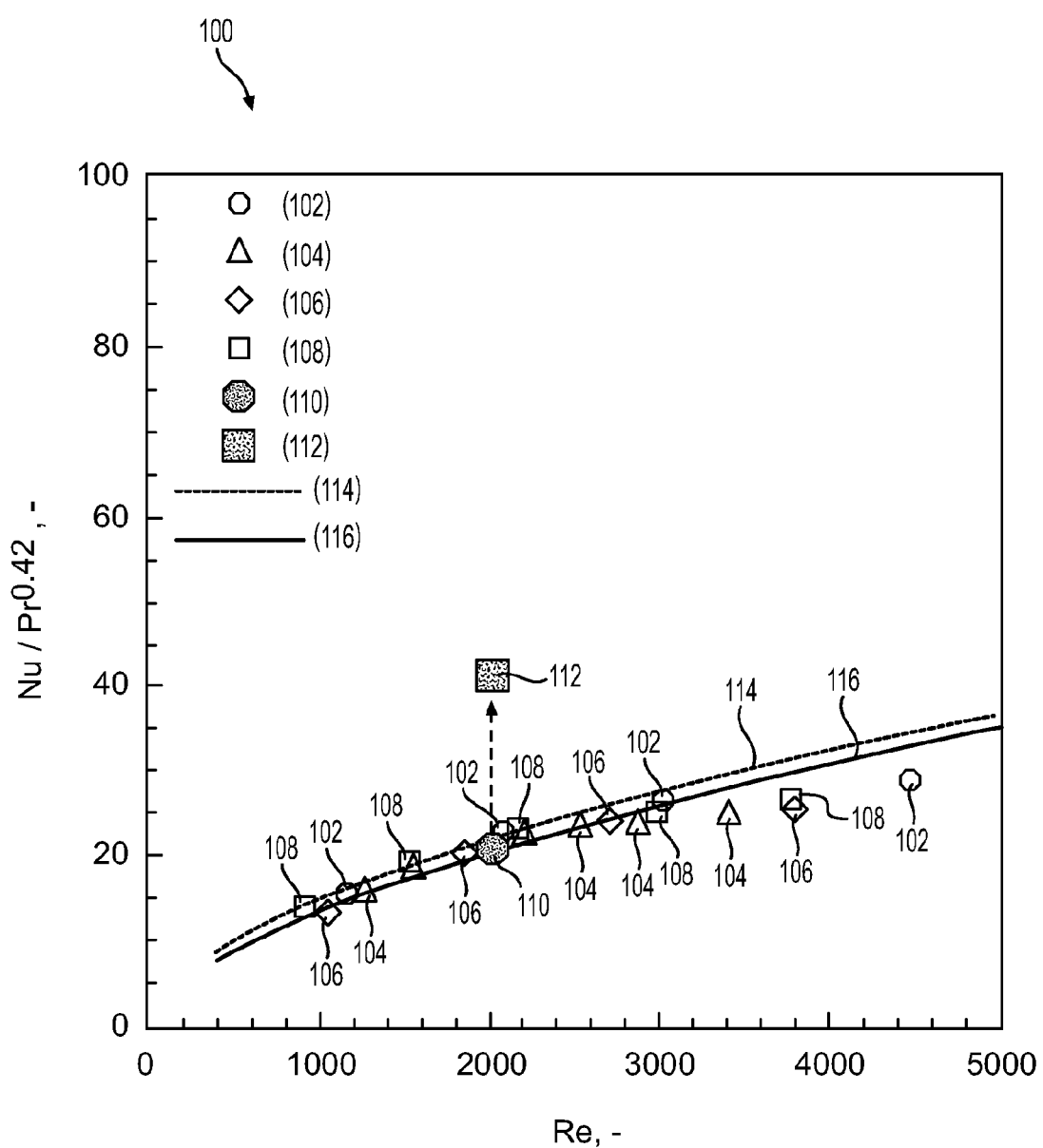
FIG. 10 is graph comparing predicted Nusselt numbers for various cooling systems, each having a single phase jet impingement heat transfer.

FIG. 10 shows graph 100 illustrating a comparison of measured and predicted Nusselt numbers (Nu) under single phase jet impingement heat transfer with and without a porous (foam) heat spreader 40 against experimental data and empirical model. Graph 100 plots $Nu/Pr^{.42}$, or (Nusselt number Nu) divided by Prandtl number $(Pr)^{0.42}$ vs. Renolds number (Re) for various cooling system configurations. Plots 102, 104, 106, 108 show experimental results for cooling systems without foam heat spreaders, and with Prandtl numbers (Pr) of 3.5, 3.8, 3.9, and 4.1, respectively. Computational fluid dynamics (CFD) simulations using a representative porous media were carried out to investigate influence on the confined jet impingement cooling performance. The CFD simulations are presented in a plots 110 and 112. Plot 110 shows CFD simulation results for a cooling system with a Prandtl number (Pr) of 6.3, and without the porous heat spreader 40. Plot 112 shows CFD simulation results for a cooling system with a Prandtl number (Pr) of 6.3, and with the porous heat spreader 40. Plot 114 shows a curve illustrating correlation for the experimentally derived results, and Plot 116 shows a curve illustrating correlation for the CFD derived results without a porous heat spreader 40.

In other words, experiments and a separate simulation were each carried out for the same system, without the porous heat spreader 40, and the dimensionless heat transfer coefficient (Nusselt number Nu) was compared with experimental data and empirical models in the literature for validation. It can be seen from FIG. 10, that the predictions for the case without the porous foam heat spreader 40 are in excellent agreement with the literature, thereby validating the computational methodology employed in this exercise. It is also seen that the computationally predicted Nusselt number for the representative case with the porous heat spreader 40 is almost twice as that without the heat spreader 40. The Nu/Pr^.42 value (which is directly proportional to the Nusselt number where the Prandtl number (Pr) remains constant) increases from about 21 to about 41 between the cases with and without the foam (i.e., without and with the porous heat spreader 40). This reinforces the effectiveness of the cooling systems 20 of the present disclosure. Furthermore, these results show that potential heat transfer augmentation of 100% or more are likely obtainable using the cooling system 20 of the present disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An impingement cooling system comprising:
   a porous heat spreader in thermal contact with a heat source; and
   a nozzle configured to direct a fluid as a jet or a spray impinging upon the porous heat spreader,
   wherein the porous heat spreader has a first porosity at a first location where the fluid impinges thereupon,
   wherein the porous heat spreader has a second porosity, less than the first porosity, at a second location spaced apart from the first location,
   wherein the porous heat spreader has a third porosity, greater than the second porosity, at a third location, and
   wherein the second location is between the first location and the third location.

2. The impingement cooling system of claim 1, wherein the nozzle is one of two or more nozzles.

3. The impingement cooling system of claim 1, wherein the porous heat spreader is made of one of: a metal, a metal alloy, carbon, graphite, or ceramic.

4. The impingement cooling system of claim 1, wherein the fluid is configured to undergo a phase change from a liquid to a gas on or within the porous heat spreader.

5. The impingement cooling system of claim 1, wherein the nozzle is configured to direct the fluid orthogonally to an impingement plate.

6. The impingement cooling system of claim 1, wherein the nozzle is configured to direct the fluid at an oblique angle to an impingement plate.

7. The impingement cooling system of claim 1, wherein the porous heat spreader is anisotropic.

8. The impingement cooling system of claim 7, wherein the porous heat spreader has a spatially-varying microstructure and porosity.

9. The impingement cooling system of claim 7, wherein the porous heat spreader has first porosity at a first location where the fluid impinges thereupon, and wherein the porous heat spreader has a second porosity, less than the first porosity, at a second location spaced apart from the first location.

10. The impingement cooling system of claim 9, wherein the porous heat spreader has a third porosity greater than the second porosity at a third location, wherein the second location is between the first location and the third location.

11. The impingement cooling system of claim 1, wherein the porous heat spreader has a monolithic structure.

12. The impingement cooling system of claim 1, wherein the porous heat spreader is one of a plurality of discrete porous heat spreaders, with each of the discrete porous heat spreaders configured to conduct heat from a common heat source.

13. The impingement cooling system of claim 1, wherein the porous heat spreader is one of a plurality of discrete porous heat spreaders, with the plurality of discrete porous heat spreaders configured to conduct heat from a plurality of independent heat sources.

14. The impingement cooling system of claim 1, wherein the porous heat spreader comprises a porous media that is one of: fibrous, a foam, a pin-fin matrix.

15. An impingement cooling system comprising:
    a porous heat spreader in thermal contact with a heat source, wherein the porous heat spreader has at least one spatially-varying property; and
    a nozzle configured to direct a fluid as a jet or a spray impinging upon the porous heat spreader,
    wherein the at least one spatially-varying property includes at least one of a microstructure or a porosity,
    wherein the at least one spatially-varying property has a first value at a first location where the fluid impinges thereupon,
    wherein the at least one spatially-varying property has a second value, less than the first value, at a second location spaced apart from the first location,
    wherein the at least one spatially-varying property has a third value, greater than the second value, at a third location, and
    wherein the second location is between the first location and the third location.

16. The impingement cooling system of claim 15, wherein the at least one spatially-varying property includes both the microstructure and the porosity.

17. The impingement cooling system of claim 15, wherein the porous heat spreader has first porosity at a first location where the fluid impinges thereupon, and wherein the porous heat spreader has a second porosity, less than the first porosity, at a second location spaced apart from the first location.

18. The impingement cooling system of claim 17, wherein the porous heat spreader has a third porosity greater than the second porosity at a third location, wherein the second location is between the first location and the third location.

19. The impingement cooling system of claim 15, wherein the nozzle is configured to direct the fluid at an oblique angle to an impingement plate.

* * * * *